(12) United States Patent
Kim et al.

(10) Patent No.: US 10,146,076 B2
(45) Date of Patent: Dec. 4, 2018

(54) DISPLAY DEVICE

(71) Applicant: SAMSUNG DISPLAY CO., LTD., Yongin-si, Gyeonggi-do (KR)

(72) Inventors: Seungwan Kim, Yongin-si (KR); Mingyu Kim, Asan-si (KR); Youngsup Kwon, Gwangmyeong-si (KR); Byungkyou Min, Seoul (KR); Jinwon Jang, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/132,398

(22) Filed: Apr. 19, 2016

(65) Prior Publication Data

US 2017/0013704 A1 Jan. 12, 2017

(30) Foreign Application Priority Data

Jul. 10, 2015 (KR) ........................ 10-2015-0098525

(51) Int. Cl.
*G02F 1/1333* (2006.01)
*G06F 1/16* (2006.01)
*G02F 1/1345* (2006.01)
*H02H 3/20* (2006.01)
*H05K 1/02* (2006.01)
(Continued)

(52) U.S. Cl.
CPC .... *G02F 1/133308* (2013.01); *G02F 1/13452* (2013.01); *G06F 1/1601* (2013.01); *H02H 3/20* (2013.01); *H05K 1/028* (2013.01); *H05K 1/181* (2013.01); *H05K 5/0017* (2013.01); *H05K 7/02* (2013.01); *H05K 7/20127* (2013.01); *G02F 1/1339* (2013.01); *G02F 1/13306* (2013.01); *G02F 2001/133314* (2013.01); *G02F 2201/46* (2013.01); *G02F 2201/50* (2013.01); *G02F 2201/56* (2013.01); *H01L 51/529* (2013.01);
(Continued)

(58) Field of Classification Search
CPC ............ G02F 1/133308; G06F 1/1601; G06F 1/1637; G06F 1/1656
USPC ..................... 349/58–60; 361/679.22–679.24
See application file for complete search history.

(56) References Cited

U.S. PATENT DOCUMENTS 7,486,519 B2* 2/2009 Loiler ...................... G06F 1/20
                                                        165/121
7,545,453 B2* 6/2009 Kim .................. G02F 1/133308
                                                        349/58
(Continued)

FOREIGN PATENT DOCUMENTS

JP  2006162641 A  6/2006
JP  2010160443 A  7/2010
(Continued)

OTHER PUBLICATIONS

Extended European Search Report for Application No. 16178602.5 dated Nov. 22, 2016.
(Continued)

*Primary Examiner* — Nidhi Thaker
(74) *Attorney, Agent, or Firm* — Cantor Colburn LLP

(57) ABSTRACT

A curved display device including: a display panel having a curvature; a frame which supports the display panel; and a control circuit coupled to the frame, where the control circuit includes a circuit board coupled to the frame, and an electronic element on a surface of the circuit board opposing the frame.

18 Claims, 9 Drawing Sheets

(51) Int. Cl.
  *H05K 1/18* (2006.01)
  *H05K 5/00* (2006.01)
  *H05K 7/02* (2006.01)
  *H05K 7/20* (2006.01)
  *G02F 1/133* (2006.01)
  *G02F 1/1339* (2006.01)
  *H01L 51/52* (2006.01)

(52) U.S. Cl.
  CPC .. *H01L 51/5237* (2013.01); *H01L 2251/5338* (2013.01)

(56) References Cited

U.S. PATENT DOCUMENTS

| | | | |
|---|---|---|---|
| 8,320,119 | B2 | 11/2012 | Isoshima et al. |
| 8,467,187 | B2 | 6/2013 | Itazawa et al. |
| 2002/0167805 | A1* | 11/2002 | Lee ........................ H05K 1/182 361/772 |
| 2004/0012729 | A1* | 1/2004 | Kim .................. G02F 1/133308 349/58 |
| 2005/0243106 | A1* | 11/2005 | Bae .................... H05K 7/20963 345/679 |
| 2006/0203143 | A1* | 9/2006 | Shin .................. G02F 1/133382 349/58 |
| 2008/0212270 | A1* | 9/2008 | Choi ........................ G06F 1/182 361/752 |
| 2010/0172098 | A1* | 7/2010 | Isoshima ............ H05K 7/20972 361/697 |
| 2014/0355805 | A1* | 12/2014 | Park ........................ H04N 5/64 381/333 |
| 2015/0042920 | A1* | 2/2015 | Lee ....................... G02F 1/1336 349/60 |
| 2015/0092362 | A1 | 4/2015 | Ahn |

FOREIGN PATENT DOCUMENTS

| | | |
|---|---|---|
| KR | 1020060105994 A | 10/2006 |
| KR | 1020080076544 A | 8/2008 |
| KR | 1020110000916 A | 1/2011 |

OTHER PUBLICATIONS

European Office Action for Application No. 16178602.5 dated Jul. 18, 2017.

* cited by examiner

DISPLAY DEVICE

This application claims priority to Korean Patent Application No. 10-2015-0098525, filed on Jul. 10, 2015, and all the benefits accruing therefrom under 35 U.S.C. § 119, the content of which in its entirety is herein incorporated by reference.

BACKGROUND

1. Field

Embodiments of the invention relate to a curved slim-type display device.

2. Description of the Related Art

With the advent of a highly developed information technology era, there are growing demands for flat panel display ("FPD") devices which are thin, lightweight and low in power consumption. In recent times, however, a curved display device, which is typically formed by bending a display panel of a flat display device to enhance an immersion effect, is being introduced. One of the recent trends in curved display devices is to use liquid crystal display ("LCD") panels or organic light emitting diode ("OLED") display panels as display panels thereof LCD devices typically include two substrates including electrodes respectively on respective opposing surfaces of the two substrates. Liquid crystal materials are injected between the two substrates, and liquid crystal molecules are rearranged by an electric field generated by voltages that are applied to the two electrodes. An image is displayed based on the transmittance of light which is adjusted by the rearrangement of the liquid crystal molecules. The LCD device includes a liquid crystal panel disposed between the two substrates and injected with liquid crystals, a backlight unit disposed below the liquid crystal panel and used as a light source, and a driving unit disposed at an outer circumference of the liquid crystal panel and driving the liquid crystal panel.

On the other hand, in OLED display devices, an OLED includes an anode and a cathode disposed to oppose one another, and an organic layer disposed between the anode and the cathode. In addition, the organic layer includes an organic light emitting layer. A hole supplied from the anode and an electron supplied from the cathode are combined in the organic light emitting layer to thereby form an exciton. The OLED emits light by energy generated when the exciton falls from an excited state to a ground state.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments of the invention are directed to a curved display device including a slim-type structure for mounting a circuit board, where the structure is provided along a curved frame.

According to an exemplary embodiment of the invention, a curved display device includes: a display panel having a curvature; a frame which supports the display panel; and a control circuit coupled to the frame, where the control circuit includes a circuit board opposite to the frame, and an electronic element on a surface of the circuit board opposing the frame.

In an exemplary embodiment, the curved display device may further include a coupling portion which couples the frame and the circuit board, where the coupling portion is coupled to the frame to form an acute angle with respect to a tangent line to a surface of a portion of the frame coupled to the coupling portion.

In an exemplary embodiment, the circuit board may be spaced apart from the frame at a distance increasing as further away from a center portion of the circuit board.

In an exemplary embodiment, the frame may include a protrusion protruding toward the circuit board.

In an exemplary embodiment, the coupling portion may be coupled to the protrusion.

In an exemplary embodiment, The circuit board may contact the protrusion.

In an exemplary embodiment, The curved display device may further include an insulating member between the frame and the circuit board.

In an exemplary embodiment, The curved display device may further include a protection member on the circuit board.

In an exemplary embodiment, the curved display device may further include a plurality of coupling portions which couples the frame and the circuit board, where the coupling portions may have different lengths from one another.

In an exemplary embodiment, one of the coupling portions on a lower portion of the frame may have a greater length than a length of another of the coupling portions on an upper portion of the frame.

In an exemplary embodiment, a coupling portion of the coupling portions may be coupled to the frame to be perpendicular with respect to a tangent line to a surface of a poriton of the frame coupled to the coupling poriton.

In an exemplary embodiment, the circuit board may have a curvature less than or equal to a curvature of the frame.

In an exemplary embodiment, a distance from a center portion of the circuit board to the frame may be the same as a distance from an end portion of the circuit board to the frame.

In an exemplary embodiment, the frame may include a protrusion protruding toward the circuit board.

In an exemplary embodiment, the coupling portion may be coupled to the protrusion.

In an exemplary embodiment, the curved display device may further include an insulating member between the circuit board and the frame.

In an exemplary embodiment, the curved display device may further include a protection member which protects a surface of the circuit board opposite to the surface of the circuit board opposing the frame.

According to another exemplary embodiment of the invention, a curved display device includes: a display panel having a curvature; a frame which supports the display panel; and a control circuit coupled to the frame, where the control circuit includes a circuit board coupled to the frame, where a mounting hole is defined in the circuit board, and a plurality of electronic elements on a surface of the circuit board opposing the frame, where at least one of the electronic elements is disposed in the mounting hole.

In an exemplary embodiment, the curved display device may further include a coupling portion which couples the frame and the circuit board, where the coupling portion may have a shorter length than a length of the mounting hole.

In an exemplary embodiment, a heat dissipation hole, through which heat generated in the electronic element is discharged, may be defined in the circuit board.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features of the invention will be more clearly understood from the following detailed description taken in conjunction with the accompanying drawings, in which.

DETAILED DESCRIPTION

Figure 1:
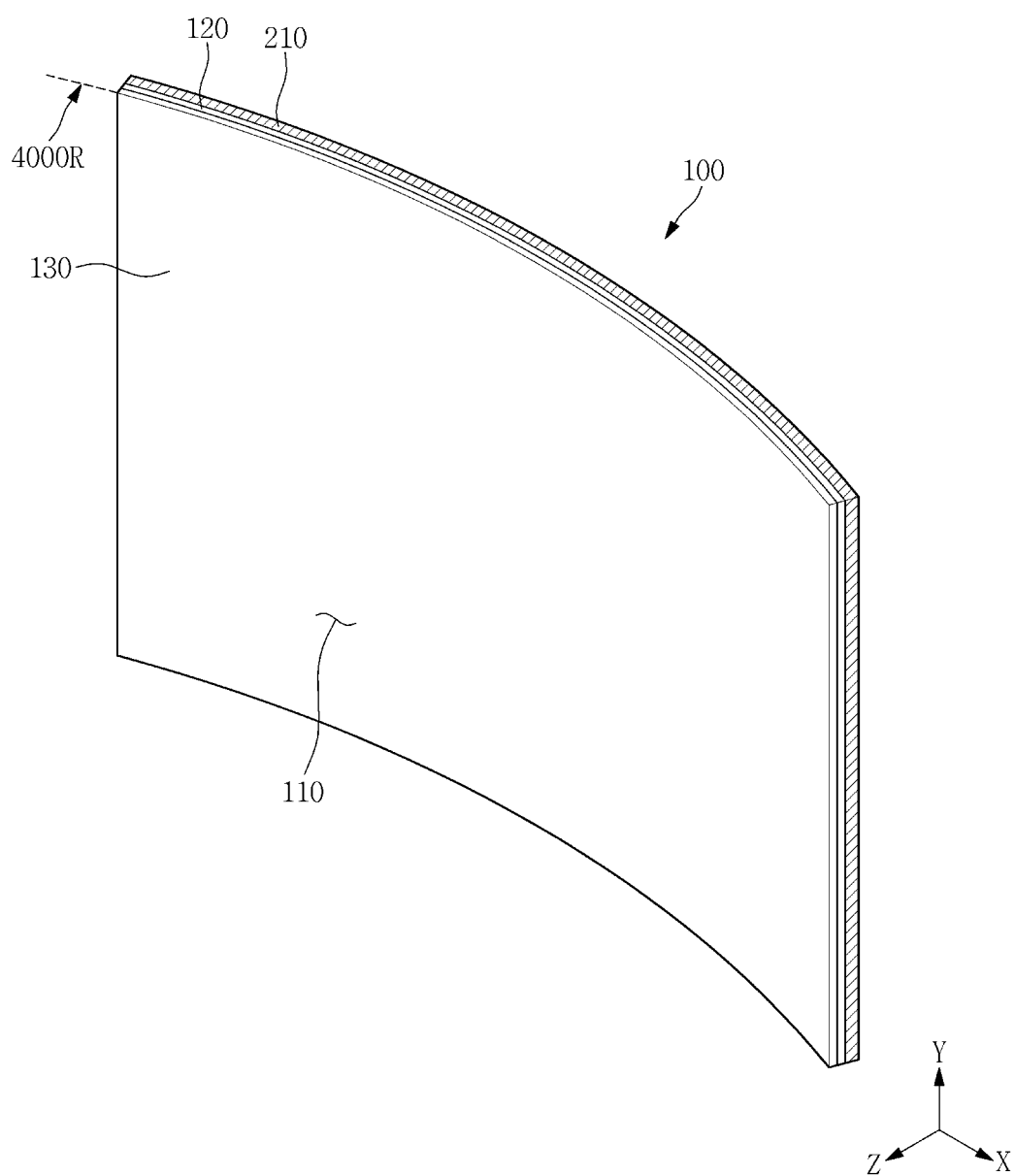
FIG. 1 is a front perspective view illustrating a display device according to an exemplary embodiment.

Exemplary embodiments will now be described more fully hereinafter with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first", "second", and the like, may be used herein to describe various elements, components, areas, layers and/or sections, these elements, components, areas, layers and/or sections should not be limited by these terms. These terms are only used to distinguish one element, component, area, layer or section from another element, component, area, layer or section. Thus, a first element, component, area, layer or section discussed below could be termed a second element, component, area, layer or section without departing from the teachings of example embodiments.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a display device will be described with reference to the accompanying drawings.

FIG. 1 is a front perspective view illustrating a display device 100 according to an exemplary embodiment.

Referring to FIG. 1, in an exemplary embodiment, the display device 100 includes: a display panel 110 including a first display substrate 120 and a second display substrate 130 opposite to one another, a liquid crystal layer (not illustrated) disposed between the first display substrate 120 and the second display substrate 130, and a circuit portion that applies a control voltage to the first display substrate 120; and a frame 210 that supports the first display substrate 120, the second display substrate 130 and the circuit portion. In such an embodiment, although not illustrated, a sealant may be disposed on respective edges of the first display substrate 120 and the second display substrate 130 to couple the second display substrate 130 to the first display substrate 120, and thereby prevent the outward exposure of the liquid crystal layer disposed between the first display substrate 120 and the second display substrate 130.

The first display substrate 120, the second display substrate 130 and the frame 210 of the display device 100 each have a predetermined curvature. The display panel 110 is curved in a length direction thereof, e.g., the x-direction, toward a viewer at a front thereof, e.g., in the z-direction. A degree of the curvature of the display panel 110 is represented by a radius of curvature, or a curvature of a circle which is an inverse number of a radius of curvature. As used herein, the radius of curvature refers to a radius of a circle that touches a curve at a given point and has the same tangent and curvature at that point, and will be expressed by a unit "R", which is a unit of length equal to 1 millimeter (mm). As the radius of curvature increases, a size of the circle increases to thereby reduce a curvature of the circle. On the other hand, as the radius of curvature decreases, the size of the circle decreases to thereby increase the curvature of the circle.

The radius of curvature of the display panel 110 and the frame 210 varies based on the size of the display panel 110 and ambient conditions. In one exemplary embodiment, for example, the radius of curvature may be in a range of about 2000 R to about 5000 R. Alternatively, based on typical viewing conditions, the radius of curvature may be may be about 4000 R. Hereinafter, for convenience of description, an exemplary embodiment where the display panel 110 has a radius of curvature of about 4000 R will be described in detail. In such an embodiment, the display panel 110 has a curvature in a length direction thereof, and is absent a curvature in a width direction thereof. Accordingly, the display device 100 that is concavely curved in the length direction with respect to a viewer at the front thereof is viewed to the viewer.

Hereinafter, for convenience of description, an exemplary embodiment where the display panel 110 is a liquid crystal display ("LCD") panel will be described in detail, but the invention is not limited thereto, and may be applicable to any slim-type display panel having a curvature.

Figure 2:
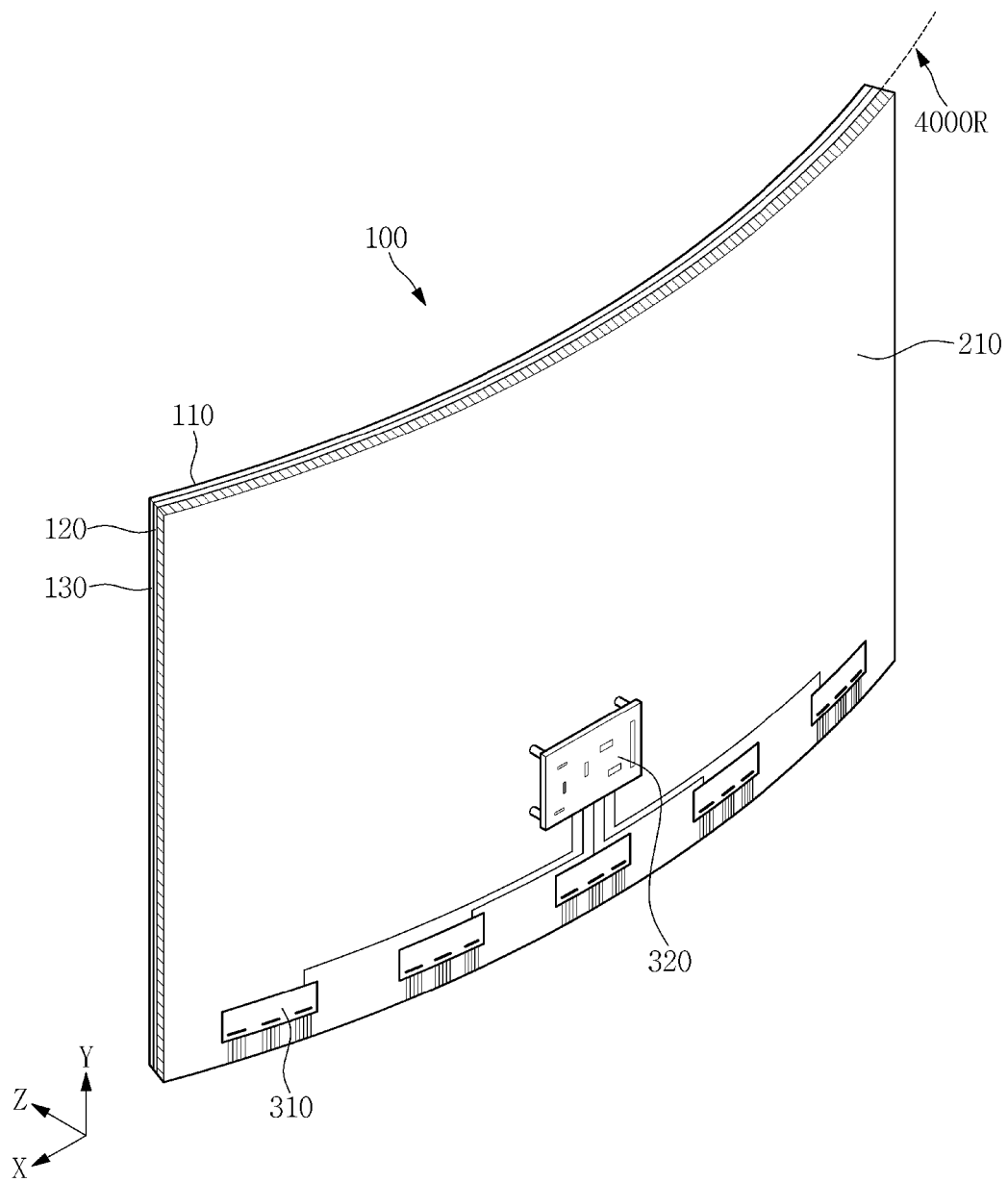
FIG. 2 is a rear perspective view illustrating a display device according to an exemplary embodiment.

FIG. 2 is a rear perspective view illustrating the display device 100 according to an exemplary embodiment.

Referring to FIG. 2, in an exemplary embodiment, the display device 100 includes the display panel 110 on a front surface of the frame 210, a data driver 310 that outputs a data voltage to the display panel 110, and a control circuit 320 that transmits a control signal to the data driver 310. Although not illustrated, the display device 100 may further include an image circuit that receives an externally applied image signal, a power supply circuit that supplies power, and the like.

In such an embodiment, where the display panel 110 is an LCD panel, the display device 100 may further include a backlight unit and a backlight driving circuit.

The frame 210 is curved corresponding to the curved shape of the display panel 110. In such an embodiment, the control circuit 320 supported by the frame 210 may have a flat or curved shape. Accordingly, a coupling portion connected to the control circuit 320 may have a shape corresponding to or suitable for a structure of the control circuit 320.

Figure 3:
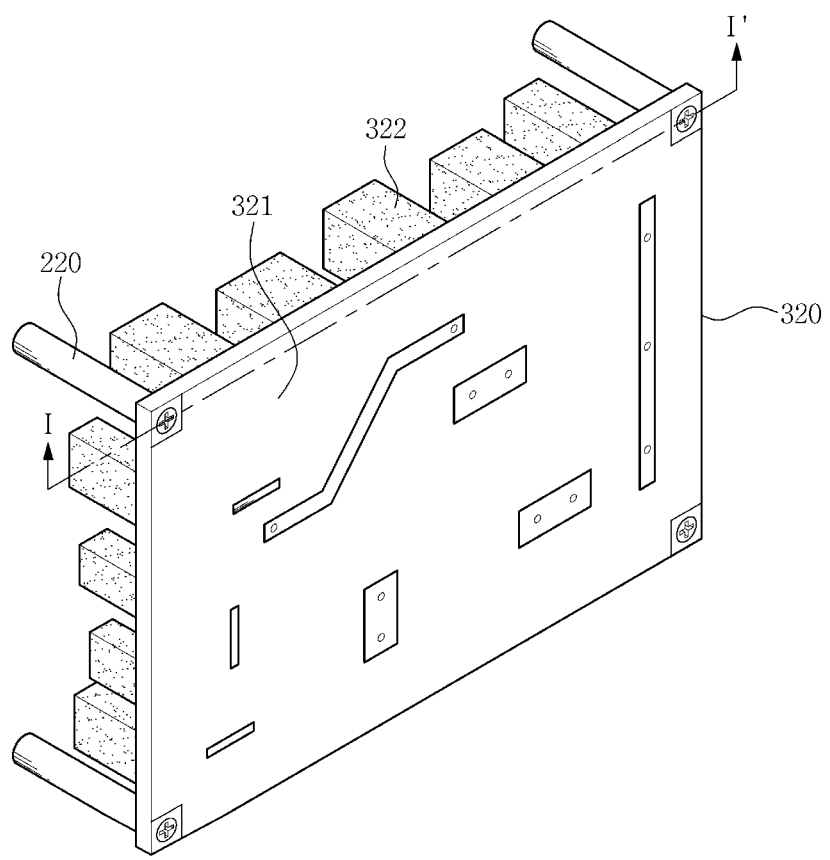
FIG. 3 is an enlarged perspective view illustrating an exemplary embodiment of a control circuit of FIG. 2.

FIG. 3 is an enlarged perspective view illustrating an exemplary embodiment of the control circuit 320 of FIG. 2.

Referring to FIG. 3, in an exemplary embodiment, the control circuit 320 includes a circuit board 321 and an electronic element 322 disposed, e.g., mounted, on the circuit board 321. The control circuit 320 and the frame 210 are connected by a coupling portion 220 to be fixed to one another. The coupling portion 220 allows the circuit board 321 and the frame 210 to be spaced apart from one another at a predetermined distance, such that a mounting space for mounting the electronic element 322 is defined or provided between the circuit board 321 and the frame 210.

In a conventional display device, an electronic element is typically disposed to face an outer side of a display device, and thus, the electronic element may be exposed to foreign materials or electric static discharge ("ESD"). In an exemplary embodiment of the invention, the electronic element 322 is on a surface of the circuit board 321 opposing or facing the frame 210. In such an embodiment, opposite sides of the electronic element 322 are shielded by the frame 210 and the circuit board 321, respectively, such that the electronic element 322 may not be exposed to a path through which foreign materials may infiltrate. In such an embodiment, the electronic element 322 may be effectively protected or shielded from electrostatic discharge ("ESD"), by the frame 210 which has conductivity.

Figure 4:
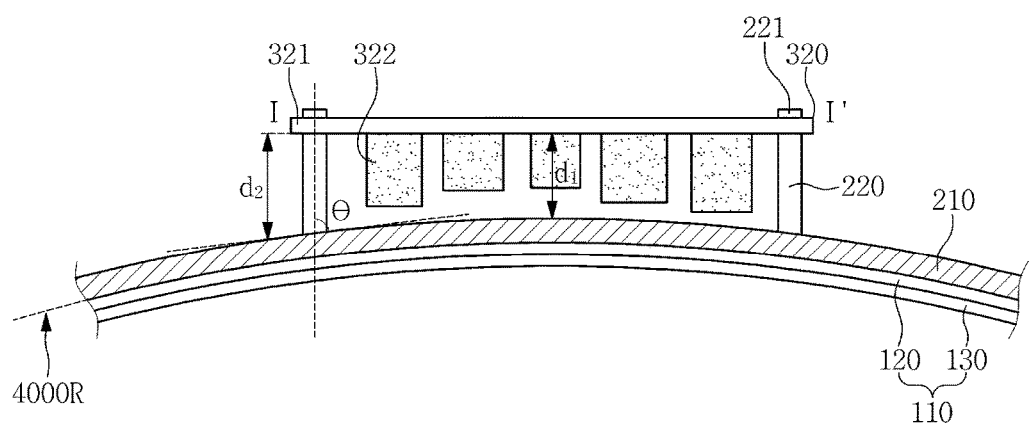
FIG. 4 is a cross-sectional view taken along section line I-I' of FIG. 3 according to an exemplary embodiment.

FIG. 4 is a cross-sectional view taken along section line I-I' of FIG. 3 according to an exemplary embodiment.

Referring to FIG. 4, in an exemplary embodiment, the display panel 110 and the frame 210 have a radius of curvature of about 4000 R, for example. The display panel 110 is supported by the frame 210, the control circuit 320 is disposed opposite to the display panel 110, and the frame 210 is disposed between the control circuit 320 and the display panel 110. The control circuit 320 is connected to the frame 210 by the coupling portion 220. One end of the coupling portion 220 is fixed to the frame 210, and another end (e.g., an opposing end) of the coupling portion 220 is connected to the circuit board 321 by a fixing member 221 that is detachable, e.g., a screw. In an exemplary embodiment where the fixing member 221 is a screw, the coupling portion 220 has a screw thread defined on an inner surface thereof The coupling portion 220 may include or be formed of a conductive metal, and may serve to electrically connect the circuit board 321 and the frame 210.

The plurality of coupling portions 220 connected to the circuit board 321 are substantially parallel to one another, and each of the coupling portions 220 is coupled to the frame 210 at an acute angle with respect to a tangent line to a surface of a coupled portion of the frame 210, which is a portion of the frame 210 coupled to the coupling portion. A coupling angle θ between the coupling portion 220 and the frame 210 varies based on a radius of curvature of the frame 210. In an exemplary embodiment, as the radius of curvature of the frame 210 decreases, the coupling angle θ between the coupling portion 220 and the frame 210 decreases. In an exemplary embodiment, where the radius of curvature of the frame 210 has a significantly large value approaching infinity, that is, when the frame 210 is substantially flat, the coupling angle θ between the coupling portion 220 and the frame 210 may be approximately 90 degrees.

The electronic elements 322 disposed in the space between the frame 210 and the circuit board 321 may have different heights from one another. In particular, however, the electronic element 322 may have a height less than the height or thickness of the space between the frame 210 and the circuit board 321 not to contact the frame 210.

In an exemplary embodiment, the circuit board 321 supported by the coupling portion 220 includes a printed circuit board ("PCB") that is flat with respect to the curved frame 210. Accordingly, a distance d1 from a center portion of the circuit board 321 to the frame 210 is shorter than a distance d2 from an end portion of the circuit board 321 to the frame 210. An electronic element 322 on the center portion of the circuit board 321 may have a relatively small height, and an electronic element 322 on the end portion of the circuit board 321 may have a relatively great height, based on the distance between the circuit board 321 and the frame 210.

Figure 5:
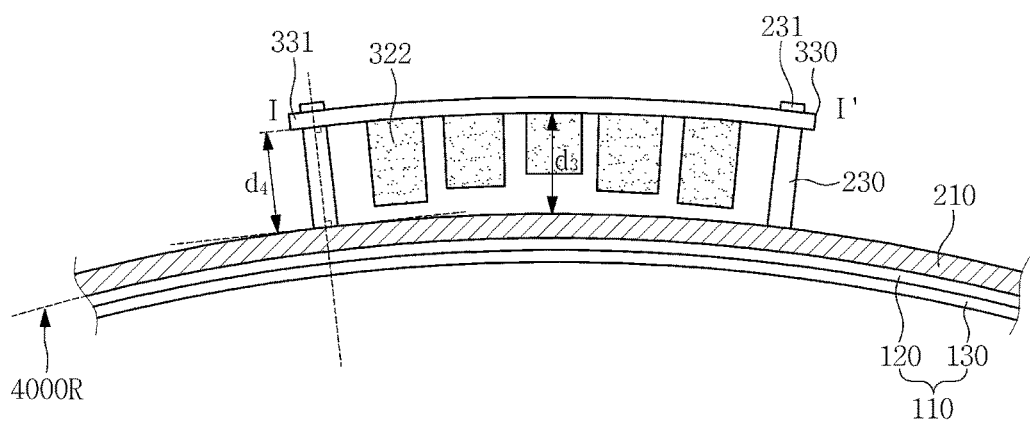
FIG. 5 is a cross-sectional view taken along section line I-I' of FIG. 3 according to an alternative exemplary embodiment.

FIG. 5 is a cross-sectional view taken along section line I-I' of FIG. 3 according to an alternative exemplary embodiment.

Referring to FIG. 5, in an exemplary embodiment, a display device 100 includes a display panel 110, a frame 210 and a control circuit 330, each of which has a curvature. A circuit board 331 of the control circuit 330 is curved to have a radius of curvature corresponding to a radius of curvature of the frame 210.

A plurality of coupling portions 230 connects the circuit board 331 and the frame 210 having respective curved surfaces, to one another. One end of the coupling portion 230 is connected to a curved surface of the frame 210 to be perpendicular with respect to a tangent line to the curved surface of the connected portion of the frame 210, which is a portion of the frame 210 connected to the coupling portion 230. In such an embodiment, another end of the coupling portion 230 is connected to the circuit board 331 to be perpendicular with respect to a tangent line to a surface of the connected portion of the circuit board 331, which is a portion of the circuit board 331 connected to the coupling portion 230.

A distance between the circuit board 331 and the frame 210 corresponds to a length of the coupling portion 230. In an exemplary embodiment where the circuit board 331 and the frame 210 have the same curvature, a distance d3 from a center portion of the circuit board 331 to the frame 210 is substantially the same as a distance d4 from an end portion of the circuit board 331 to the frame 210.

In an exemplary embodiment, the circuit board 331 includes a PCB. In such an embodiment, the PCB may be manufactured by patterning a conductive material such as copper (Cu) on an insulating plate including or formed of phenol, epoxy, or the like. In an exemplary embodiment, the PCB has a multilayer structure, and such a multilayer PCB may be manufactured by strongly compressing a plurality of insulating plates and a plurality of conductive plates that are alternately stacked. In an exemplary embodiment, the PCB may be curved, and such a curved PCB may be manufactured by heating and applying pressure to insulating plates and conductive plates that are stacked, using a curved press.

In an alternative exemplary embodiment, the circuit board 331 may have different curvatures in the center portion and the end portion thereof. In one exemplary embodiment, for example, the circuit board 331 may have a smaller curvature in the center portion thereof than that in the end portion thereof. In such an embodiment, the center portion of the circuit board 331 may be connected with a wiring formed by patterning a conductive plate and with an electronic element 322. In such an embodiment, the end portion of the circuit board 331 may disconnected from the electronic element 322. In the center portion of the circuit board 331 on which the electronic element 322 is mounted, cracks may occur due to a load of the electronic element 322 or a short-circuit may occur as the curvature of the circuit board 331 increases. In such an embodiment, the end portion of the circuit board 331 may not experience adverse effects that may be caused by a curvature, due to the absence of the electronic element 322.

In an exemplary embodiment where the circuit board 331 has a plurality of curvatures, the distance d3 from the center portion of the circuit board 331 to the frame 210 may be shorter than the distance d4 from the end portion of the circuit board 331 to the frame 210.

Figure 6:
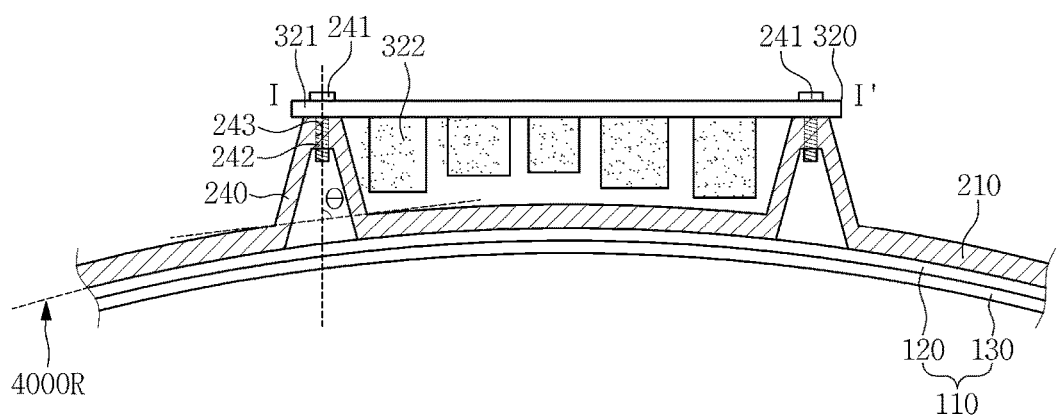
FIG. 6 is a cross-sectional view illustrating a protrusion according to another alternative exemplary embodiment.

FIG. 6 is a cross-sectional view illustrating a protrusion 240 according to another alternative exemplary embodiment.

Referring to FIG. 6, in an exemplary embodiment, a frame 210 includes the protrusion 240 connected to a control circuit 320. The protrusion 240 protrudes from the frame 210 and contacts the control circuit 320, and a fixing hole 243 is defined in an upper surface of the protrusion 240. The fixing hole 243 may include a screw thread 242 for fixing a circuit board 321 to the protrusion 240. An electronic element 322 mounted on the circuit board 321 is provided in a space between the circuit board 321 and the frame 210. As the protrusion 240 protrudes from the frame 210, an additional coupling portion to be coupled to the frame 210 may be omitted, thus simplifying the assembly process thereof.

The protrusion 240 may have a hollow interior space, and a fixing member 241 fixed to the protrusion 240 connects the circuit board 321 and the frame 210. In such an embodiment, a line extending from the fixing member 241 corresponds to a central axis of the protrusion 240. In such an embodiment, the line extending from the fixing member 241 intersects a tangent line to a curved surface of the frame 210 to form an acute angle, for example, a coupling angle θ, with respect thereto.

The protrusion 240 has a shape that tapers from a base to a truncated apex thereof, and the truncated apex of the protrusion 240 contacts the circuit board 321. A portion of the circuit board 321 contacting the frame 210 may include a ground pad portion (not illustrated) having a ground potential. The protrusion 240 contacting the ground pad portion of the circuit board 321 has conductivity, and is electrically connected to the ground pad portion. The circuit board 321 supported by the protrusion 240 may include a planar PCB. The frame 210 having conductivity serves to support the circuit board 321 and maintain a uniform level of a ground voltage of the control circuit 320.

Figure 7:
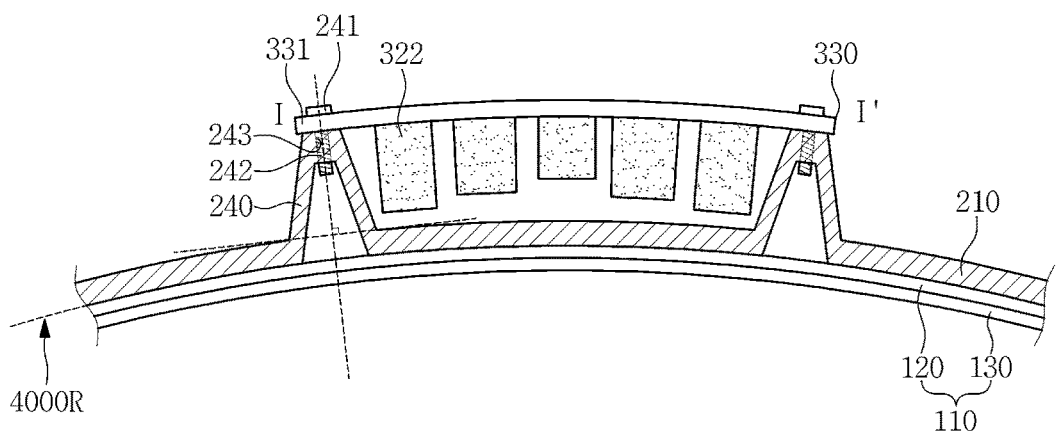
FIG. 7 is a cross-sectional view illustrating a protrusion according to still another alternative exemplary embodiment.

FIG. 7 is a cross-sectional view illustrating a protrusion 240 according to another alternative exemplary embodiment.

Referring to FIG. 7, in an exemplary embodiment, a frame 210 includes or is formed of a conductive metal, and includes the protrusion 240 connected to a control circuit 330. The protrusion 240 protrudes from the frame 210 and contacts the control circuit 330, and a fixing hole 243 is defined in an upper surface of the protrusion 240. The fixing hole 243 includes a screw thread 242 formed on an inner surface thereof to allow the control circuit 330 to be fixed to the protrusion 240. An electronic element 322 mounted on a circuit board 331 is positioned in a space between the circuit board 331 and the frame 210. Through the use of the protrusion 240 protruding from the frame 210, an additional coupling member may be omitted, thus simplifying the assembly process thereof In such an embodiment, the frame 210 may have a curved surface having a radius of curvature of about 4000 R. A portion of the frame 210 protrudes to form the protrusion 240. The protrusion 240 has a shape that tapers from a base to a truncated apex thereof. A ground pad portion (no illustrated) may be exposed through the portion of the circuit board 331 contacting the protrusion 240. The ground pad portion and the protrusion 240 are electrically connected to one another, and the frame 210 connected to the circuit board 331 through the protrusion 240 has conductivity and serves as a ground point of the control circuit 330.

In such an embodiment, a conductive intermediary member may further be included to compensate for conductivity between the circuit board 331 and the protrusion 240.

A fixing member 241 fixes the circuit board 331 and the protrusion 240 to one another. The fixing member 241 is coupled to the protrusion 240 to connect the circuit board 331 and the frame 210 to one another. In such an embodiment, a line extending from the fixing member 241 corresponds to a central axis of the protrusion 240, and the line extending from the fixing member 241 intersects a tangent line to the curved surface of the frame 210 to be substantially perpendicular thereto.

Figure 8:
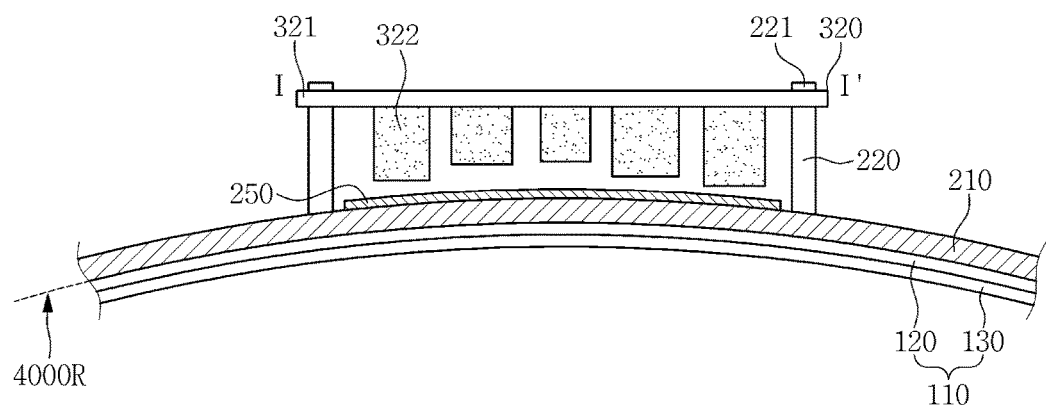
FIG. 8 is a cross-sectional view illustrating a display device according to further another alternative exemplary embodiment.

FIG. 8 is a cross-sectional view illustrating a display device according to another alternative exemplary embodiment.

An electronic element 322 mounted on a circuit board 321 is spaced apart from a conductive frame 210 at a distance of several millimeters. In such an embodiment, the distance between the electronic element 322 and the frame 210 may be set to be relatively short to achieve the slimness of the display device. However, as the distance therebetween decreases, the electronic element 322 and the frame 210 may experience a short-circuit that occurs therebetween due to physical impacts or foreign materials.

Referring to FIG. 8, an exemplary embodiment of the display device further includes an insulating member 250 between the frame 210 and a control circuit 320. The insulating member 250 effectively prevents an electric short-circuit from occurring between the electronic element 322 and the frame 210.

The insulating member 250 is an insulating film or an insulating layer formed through coating. The insulating member 250 may include or be formed of polyolefin-based plastic such as polyethylene ("PE") or polypropylene ("PP"), polyester-based plastic such as polyethylene terephthalate ("PET"), and polyvinyl-based plastic such as polyvinyl chloride ("PVC"). The insulating member 250 further includes an adhesive layer, and may adhere or stick to the frame 210.

The insulating member 250 may be disposed on the frame 210 to be spaced apart from the electronic element 322 at a distance of several millimeters, or may contact the electronic element 322. In an exemplary embodiment where the insulating member 250 contacts both the electronic element 322 and the frame 210, vibrations occurring in the electronic element 322 may be suppressed to thereby reduce noise.

In FIG. 8, an exemplary embodiment where the control circuit 320 includes a planar PCB is illustrated, but not being limited thereto. In an alternative exemplary embodiment, the insulating member 250 may be provided in a display device including a curved PCB to protect the display device.

Figure 9:
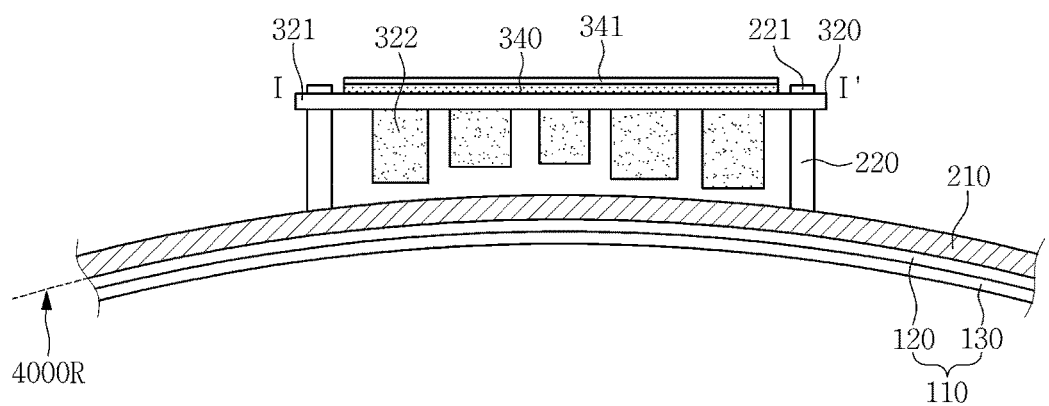
FIG. 9 is a cross-sectional view illustrating a display device according to still another alternative exemplary embodiment.

FIG. 9 is a cross-sectional view illustrating a display device according to another alternative exemplary embodiment.

Referring to FIG. 9, in an exemplary embodiment, a circuit board 321 includes a multilayer PCB including a plurality of insulating layers and a plurality of conductive layers. In such an embodiment, the multilayer PCB includes a conductive wiring on a surface thereof, e.g., a first surface, on which an electronic element 322 is not disposed. An opposing surface, e.g., a second surface opposite to the first surface, of the circuit board 321, on which the electronic element 322 is not disposed, faces a rear chassis, such that the conductive wiring exposed on the opposing surface of the circuit board 321 may contact an apparatus such as the rear chassis (not illustrated), and the like.

In such an embodiment, a protection member 340 may be disposed on the opposing surface of the circuit board 321 to cover the conductive wiring on the opposing surface of the circuit board 321, to thereby insulate and protect the conductive wiring. The protection member 340 may include an insulating film that adheres to the circuit board 321 or an insulating layer coated on the opposing surface of the circuit board 321. The protection member 340 may include or be formed of an insulating material including at least one selected from polyolefin-based plastic such as polyethylene ("PE") or polypropylene ("PP"), polyester-based plastic such as polyethylene terephthalate ("PET"), and polyvinyl-based plastic such as polyvinyl chloride ("PVC").

In such an embodiment, the protection member 340 may further include a conductive layer 341. The conductive layer 341 may include or be formed of one of nickel (Ni), copper (Cu), silver (Ag), potassium (K), magnesium (Mg), cadmium (Cd), and aluminum (Al), and may be connected to a reference voltage wiring of the circuit board 321. The conductive layer 341, which is connected to the ground, may protect the opposing surface of the circuit board 321, may block externally applied ESD, and may block electromagnetic radiation ("EMR") emitted from the circuit board 321.

The protection member 340 may be in the form of a film formed by stacking the insulating layer and the conductive layer 341, or may be the insulating layer coated on the conductive layer 341. In an alternative exemplary embodiment, the insulating layer may be omitted, and the protection member 340 may include only the conductive layer 341 spaced apart from the opposing surface of the circuit board 321.

Figure 10:
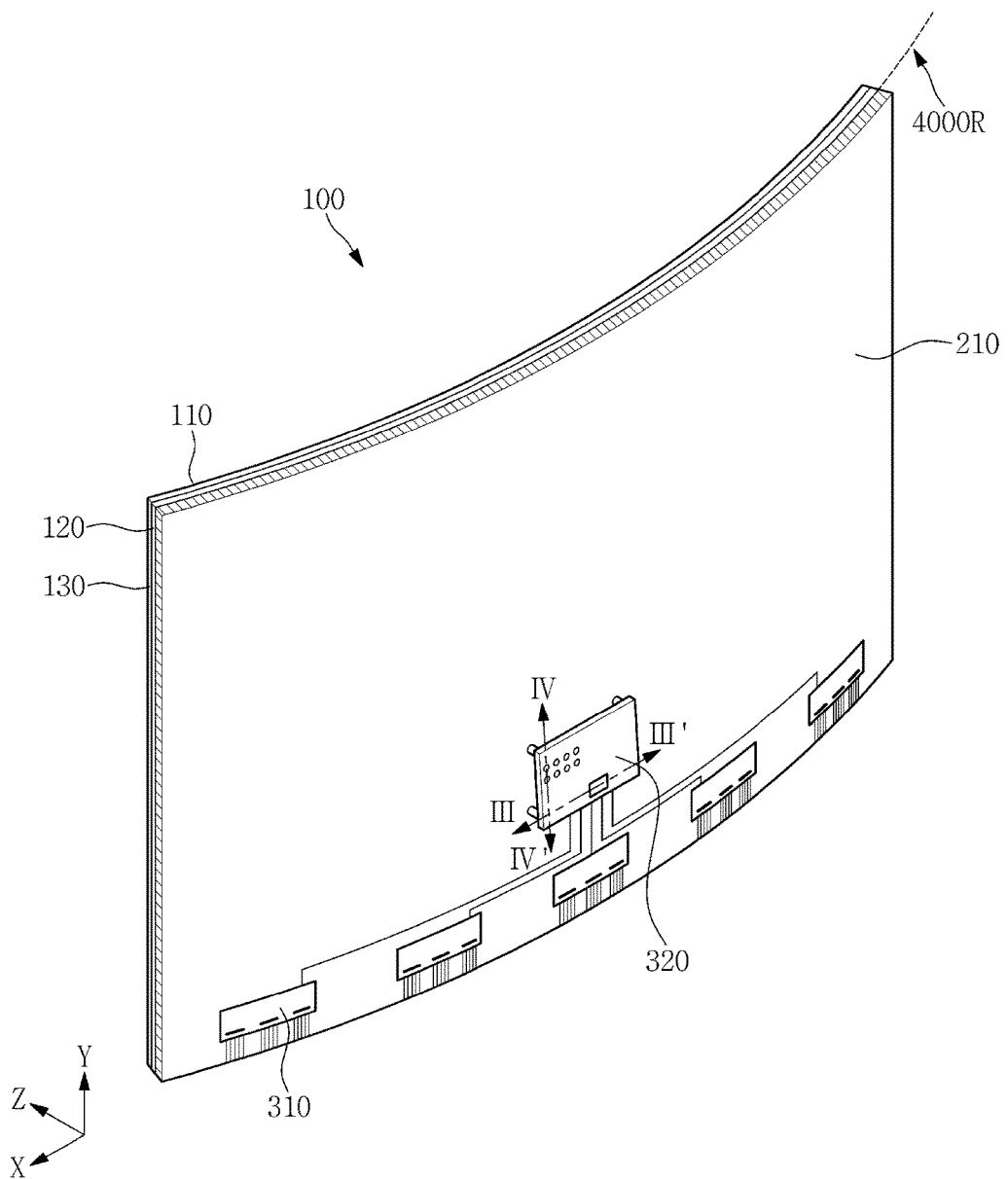
FIG. 10 is a perspective view illustrating a display device according to yet another alternative exemplary embodiment.

FIG. 10 is a perspective view illustrating a display device 100 according to another alternative exemplary embodiment.

Figure 11:
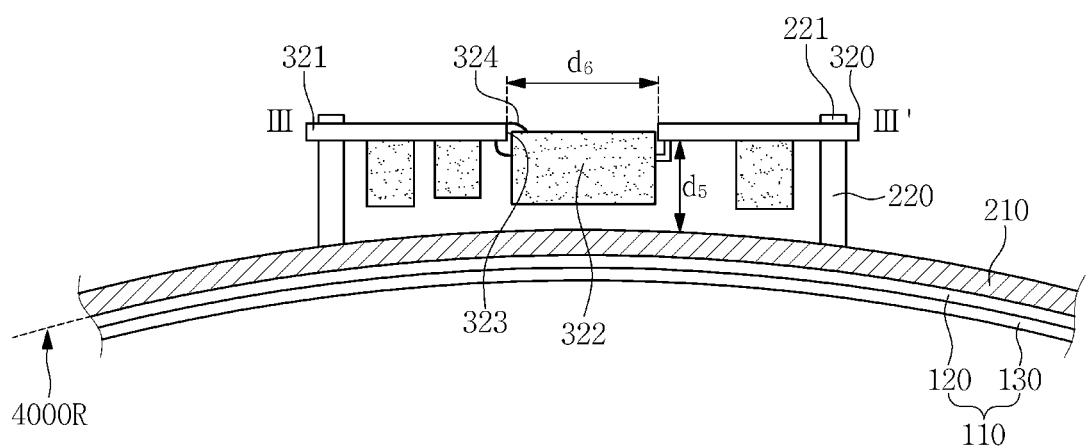
FIG. 11 is a cross-sectional view taken along section line III-III' of FIG. 10.

Referring to FIG. 10, in an exemplary embodiment, the display device 100 includes a display panel 110 on a front surface of a frame 210, a data driver 310 that outputs a data voltage to the display panel 110, and a control circuit 320 that transmits a control signal to the data driver 310. In such an embodiment, as shown in FIG. 11, the display device 100 may further include a coupling portion 220 that connects the frame 210 and the control circuit 320. In such an embodiment, the coupling portions 220 which support the control circuit 320 have different lengths from one another based on the position thereof. In an exemplary embodiment, a coupling portion 220 on a lower portion of the frame 210 has a greater length than that of a coupling portion 220 on an upper portion of the frame 210.

In such an embodiment, as shown in FIG. 11, a mounting hole, in which electronic element 322 is disposed, and a heat dissipation hole may further be defined in the control circuit 320, e.g., in the circuit board 321 thereof.

FIG. 11 is a cross-sectional view taken along section line III-III' of FIG. 10.

Referring to FIG. 11, in an exemplary embodiment, an electronic element 322 is disposed in a mounting hole 323 defined in the circuit board 321.

A height of the electronic element 322 disposed or mounted on the circuit board 321 is limited by a length of the coupling portion 220. To mount an electronic element 322 having a length greater than a distance d5 between the frame 210 and the circuit board 321, a mounting hole 323 in the circuit board 321 may have an opening length d6 greater than the length of the electronic element 322. The mounting hole 323 may be a through hole defined in the circuit board 321 corresponding to a position of the electronic element 322 and extending in a length direction of the circuit board 321. In an exemplary embodiment, an electronic element 322 having a relatively great height, such as an electrolytic capacitor, is positioned in the mounting hole 323.

A side of the electronic element 322 in a length direction thereof is positioned in the mounting hole 323, such that the electronic element 322 may be mounted on the circuit board 321 even in a case in which the coupling portion 220 has a small height. In an exemplary embodiment, a length or width of the mounting hole 323 may be greater than a length of the coupling portion 220. In such an emobdiment, a length and a width of the mounting hole 323 are formed to be greater than those of the electronic element 322 having a relatively great height to thereby allow the electronic element 322 to be relatively easily mounted in the manufacturing process thereof. A lead line of the electronic element 322 in the mounting hole 323 electrically connects the electronic element 322 and the circuit board 321, and supports the electronic element 322 disposed in the length direction thereof.

A control circuit 320 may further include an adhesive member 324 in a space between the mounting hole 323 and the electronic element 322. The adhesive member 324 effectively prevents the escape of the electronic element 322 from the mounting hole 323 due to the deformation of the lead line of the electronic element 322 that may occur over the course of time. The adhesive member 324 may include or be formed of a resin having adhesiveness or stickiness in the space between the electronic element 322 and the mounting hole 323. In an alternative exemplary embodiment, the adhesive member 324 may include an insulating jig or the like that prevents the displacement of the electronic element 322.

Figure 12:
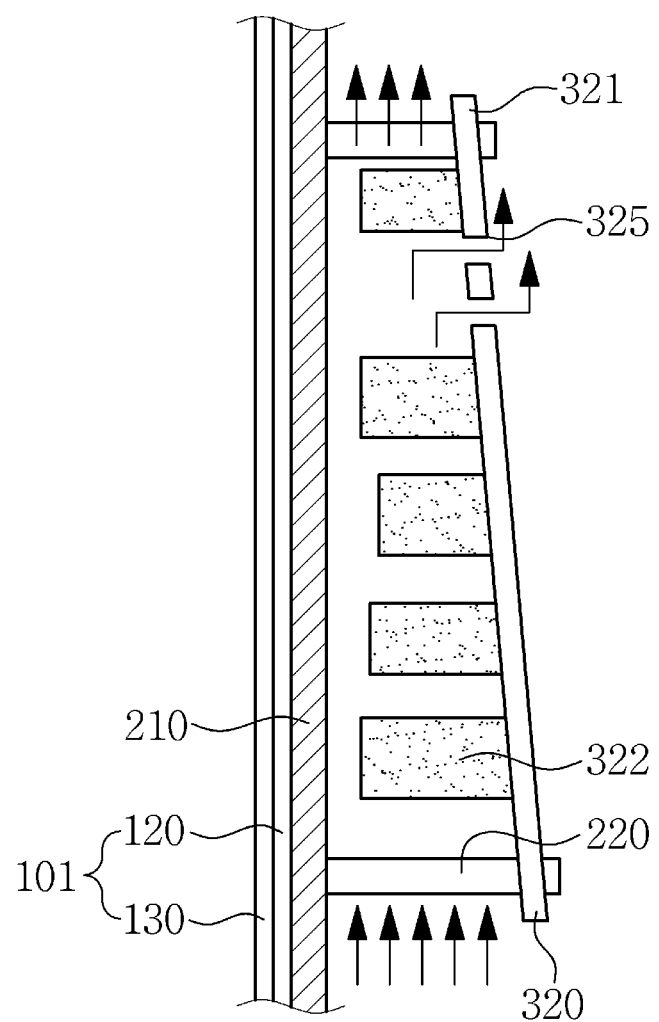
FIG. 12 is a cross-sectional view taken along section line IV-IV' of FIG. 10.

FIG. 12 is a cross-sectional view taken along section line IV-IV' of FIG. 10.

Referring to FIG. 12, in an exemplary embodiment, a coupling portion 220 on the lower portion of the frame 210 has a greater length than that of a coupling portion 220 on the upper portion of the frame 210.

In an exemplary embodiment, where the electronic element 322 is in the space between the frame 210 and the circuit board 321 with the coupling portion 220 therebetween, heat generated in the electronic element 322 is desired to be sufficiently dissipated or discharged. The cooling of the electronic element 322 may use an air cooling scheme in which cooling is performed using a flow of ambient air around the electronic element 322. The air cooling scheme refers to a scheme in which the ambient air that is heated by the electronic element 322 moves to an upper portion of the space in which the electronic element 322 is mounted and cool air is filled in a lower portion of the space in which the electronic element 322 is mounted. The air cooling scheme may be performed without using an additional apparatus or a refrigerant.

In an exemplary embodiment, a coupling portion 220 having a relatively great length is disposed on the lower portion of the control circuit 320, a distance between the frame 210 and the circuit board 321 in the lower portion of the control circuit 320 is increased, and an amount of air flowing from the lower portion of the space in which the electronic element 322 is mounted is increased. As the amount of cool air flowing into the space is increased, hot air around the electronic element 322 may flow smoothly, thus enhancing cooling efficiency.

In such an embodiment, the circuit board 321 may further have a ventilation hole 325 defined in an upper portion thereof. When air heated due to being blocked by the electronic element 322 is not discharged and is stagnated in the space between the circuit board 321 and the frame 210, cooling efficiency may deteriorate. The ventilation hole 325 is defined in the circuit board 321 based on the arrangement of the electronic elements 322, such that the heated air may not be stagnated inside the circuit board 321 and may be discharged through the ventilation hole 325 outwardly. The ventilation hole 325 is a through hole defined in the circuit board 321 that allows air to flow from the inside of the circuit board 321 to the outside thereof. The ventilation hole 325 may be defined in the upper portion of the circuit board 321 for the smooth flowing of the heated air, or may be defined in a portion of the circuit board 321 above a portion thereof on which the electronic element 322 is disposed.

As set forth above, according to one or more exemplary embodiments, the curved display device may be provided as a slim-type display device including the control circuit including the electronic element disposed on a surface of the circuit board opposing the frame.

From the foregoing, it will be appreciated that various embodiments in accordance with the invention have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A curved display device comprising:
a display panel having a curvature;
a frame which supports the display panel;
a control circuit coupled to the frame; and
a coupling portion which couples the frame and the control circuit,
wherein the control circuit comprises:
a circuit board coupled to the frame; and
a plurality of electronic elements on a surface of the circuit board opposing the frame such that the plurality of electronic elements is disposed between the circuit board and the frame, and the height of the plurality of electronic elements is less than the height of the coupling portion,
wherein the frame is disposed between the circuit board and the display panel, and the circuit board is spaced apart from the frame at a distance increasing as further away from a center portion of the circuit board to an end portion of the circuit board, and an electronic element of the plurality of electronic elements on the center portion of the circuit board has a smaller height than another electronic element of the plurality of electronic elements on the end portion of the circuit board.

2. The curved display device of claim 1, wherein the coupling portion is coupled to the frame at an acute angle with respect to a surface of a portion of the frame coupled to the coupling portion.

3. The curved display device of claim 1, wherein the frame comprises a protrusion protruding toward the circuit board.

4. The curved display device of claim 3, wherein the coupling portion is coupled to the protrusion.

5. The curved display device of claim 4, wherein the circuit board contacts the protrusion.

6. The curved display device of claim 1, further comprising: an insulating member between the frame and the circuit board.

7. The curved display device of claim 6, further comprising:
a protection member on the circuit board.

8. The curved display device of claim 1, further comprising: a plurality of coupling portions which couples the frame and the circuit board, wherein the coupling portions have different lengths from one another.

9. The curved display device of claim 8, wherein the curved display panel is curved in a length direction and is not curved in a width direction, and at least two coupling portions of the plurality of coupling portions are arranged in the width direction, and one of the two coupling portions has a greater length than a length of the other of the two coupling portions.

10. The curved display device of claim 1, wherein a coupling portion of the coupling portions is coupled to the frame to be perpendicular with respect to a surface of a portion of the frame coupled to the coupling portion.

11. The curved display device of claim 10, wherein the circuit board has a curvature greater than 0 and less than or equal to a curvature of the frame.

12. The curved display device of claim 11, wherein the frame comprises a protrusion protruding toward the circuit board.

13. The curved display device of claim 12, wherein the coupling portion is coupled to the protrusion.

14. The curved display device of claim 13, further comprising:
an insulating member between the circuit board and the frame.

15. The curved display device of claim 13, further comprising:
a protection member which protects a surface of the circuit board opposite to the surface of the circuit board opposing the frame.

16. A curved display device comprising: a display panel having a curvature; a frame which supports the display panel; a control circuit coupled to the frame; and a coupling portion which couples the frame and the control circuit, wherein the control circuit comprises: a circuit board coupled to the frame, wherein a mounting hole is defined in the circuit board; and a plurality of electronic elements on a surface of the circuit board opposing the frame such that the plurality of electronic elements are disposed between the circuit board and the frame, wherein the frame is disposed between the circuit board and the display panel, wherein at least one of the electronic elements is disposed in the mounting hole, wherein the display panel is curved in a length direction and is not curved in a width direction, and wherein a height of the coupling portion on a lower portion of the frame in the width direction is greater than a height of the coupling portion on an upper portion of the frame in the width direction.

17. The curved display device of claim 16, wherein the coupling portion has a shorter length than a length of the mounting hole.

18. The curved display device of claim 16, wherein
a heat dissipation hole, through which heat generated in the electronic elements is discharged, is defined in the circuit board, and
the heat dissipation hole is closer to the coupling portion on the upper portion of the frame than the coupling portion on the lower portion of the frame.

* * * * *